(12) United States Patent
Sakong et al.

(10) Patent No.: US 7,736,925 B2
(45) Date of Patent: Jun. 15, 2010

(54) METHOD OF FABRICATING NITRIDE-BASED SEMICONDUCTOR LASER DIODE

(75) Inventors: Tan Sakong, Suwon-si (KR); Youn-joon Sung, Yongin-si (KR); Ho-sun Paek, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 16 days.

(21) Appl. No.: 11/448,800

(22) Filed: Jun. 8, 2006

(65) Prior Publication Data

US 2007/0087460 A1 Apr. 19, 2007

(30) Foreign Application Priority Data

Oct. 19, 2005 (KR) ............ 10-2005-0098724

(51) Int. Cl.
*H01L 21/00* (2006.01)
(52) U.S. Cl. .................. 438/39; 438/41; 438/44; 438/46; 257/E21.365
(58) Field of Classification Search .......... 438/22, 438/39, 41, 44; 257/E21.365
See application file for complete search history.

(56) References Cited

U.S. PATENT DOCUMENTS

| 5,524,017 | A | | 6/1996 | Endo |
| 6,051,849 | A | * | 4/2000 | Davis et al. ............ 257/103 |
| 6,465,809 | B1 | * | 10/2002 | Furukawa et al. ........ 257/94 |
| 2003/0168666 | A1 | * | 9/2003 | Okuyama et al. ........ 257/80 |
| 2004/0051107 | A1 | * | 3/2004 | Nagahama et al. ....... 257/79 |
| 2005/0151153 | A1 | * | 7/2005 | Kamikawa et al. ....... 257/103 |
| 2006/0163603 | A1 | * | 7/2006 | Takeuchi et al. ........ 257/103 |

FOREIGN PATENT DOCUMENTS

| EP | 1 583 189 | 10/2005 |
| JP | 4-225586 | 8/1992 |
| JP | 11-150320 | 6/1999 |

OTHER PUBLICATIONS

European Search Report Application/Patent No. 06253489.6-2222 dated Oct. 31, 2007.

* cited by examiner

*Primary Examiner*—Thanhha Pham
*Assistant Examiner*—Tony Tran
(74) *Attorney, Agent, or Firm*—Cantor Colburn LLP

(57) ABSTRACT

A method of manufacturing a nitride-based semiconductor laser diode that can minimize optical absorption on a cavity mirror plane and improve the surface roughness of the cavity mirror plane is provided. The method includes the steps of: forming on a (0001) GaN (gallium nitride) substrate having at least two masks spaced apart by a distance equal to a laser cavity length in stripes that extend along the <11-20> direction; growing an n-GaN layer on the GaN substrate between the masks so that two (1-100) edges of the n-GaN layer are thicker than the remaining regions thereof; sequentially stacking an n-clad layer, an active layer, and a p-clad layer on the n-GaN layer to form an edge-emitting laser cavity structure in which laser light generated in the active layer passes through a region of the n-clad layer aligned laterally with the active layer and is output; and etching a (1-100) plane of the laser cavity structure to form a cavity mirror plane.

18 Claims, 15 Drawing Sheets

METHOD OF FABRICATING NITRIDE-BASED SEMICONDUCTOR LASER DIODE

CROSS-REFERENCE TO RELATED PATENT APPLICATION

This application claims the benefit of Korean Patent Application No. 10-2005-0098724, filed on Oct. 19, 2005, in the Korean Intellectual Property Office, the disclosure of which is incorporated herein in its entirety by reference.

BACKGROUND OF THE DISCLOSURE

1. Field of the Disclosure

The present disclosure relates to a method of fabricating a nitride-based semiconductor laser diode, and more particularly, to a method of manufacturing a nitride-based semiconductor laser diode that can minimize optical absorption on a cavity mirror plane and improve the surface roughness of the cavity mirror plane.

2. Description of the Related Art

In an edge-emitting semiconductor laser diode, when laser light emerges from an exit surface, the semiconductor crystalline structure on the exit surface is distorted due to high photon density and Joule heating, thereby increasing optical absorption and laser threshold current. An increased laser threshold current may degrade the thermal characteristics of the laser diode, thus increasing the optical absorption on an exit surface. The degradation in optical characteristics occurs exponentially and becomes a major factor leading to an abrupt shortening of the life span of a semiconductor laser diode. This is called a 'catastrophic optical damage' (COD).

A quality factor (Q) indicating laser cavity efficiency is one of primary factors influencing the characteristics of a semiconductor laser diode. The roughness of a cavity facet is one of the most important factors in determining the quality factor Q. As the roughness of the cavity facet is closer to zero, the quality factor Q increases, thus improving the laser characteristics. A cavity mirror plane is formed using notch and cleaving during the manufacturing of a nitride-based semiconductor laser. As widely known in the art, it is difficult to form a cavity mirror plane having a roughness close to that of an atomically single plane using this technique.

Thus, there is an urgent need to develop a process of manufacturing a semiconductor laser diode that can minimize optical absorption on a cavity mirror plane by forming a cavity mirror plane with an improved roughness close to that of an atomically single plane.

SUMMARY OF THE DISCLOSURE

The present invention may provide a method of manufacturing a nitride-based semiconductor laser diode that can minimize optical absorption on a cavity mirror plane and improve the surface roughness of the cavity mirror plane.

According to an aspect of the present invention, there may be provided a method of manufacturing a nitride-based semiconductor laser diode including the steps of: forming on a (0001) GaN (gallium nitride) substrate having at least two masks spaced apart by a distance equal to a laser cavity length in stripes that extend along the <11-20> direction; growing an n-GaN layer on the GaN substrate between the masks so that two (1-100) edges of the n-GaN layer are thicker than the remaining regions thereof; sequentially stacking an n-clad layer, an active layer, and a p-clad layer on the n-GaN layer to form an edge-emitting laser cavity structure in which laser light generated in the active layer passes through a region of the n-clad layer aligned laterally with the active layer and is output; and etching a (1-100) plane of the laser cavity structure to form a cavity mirror plane.

The mask may be formed of a material selected from the group consisting of $SiO_2$, SiN, and W.

Alternatively, the n-GaN layer may be formed by ELO (Epitaxial Lateral Overgrowth). The (1-100) plane of the laser cavity structure is etched by wet etching. An etchant used in the wet etching is a material selected from the group consisting of KOH dissolved in ethylene glycol, molten KOH, NaOH dissolved in ethylene glycol, molten NaOH, and phosphoric acid.

The ELO includes the steps of: forming additional stripe-patterned masks in the <1-100> direction between the <11-20> oriented masks; and epitaxially growing the n-GaN layer on the GaN substrate not covered with the <1-100> and <11-20> oriented masks. The <1-100> oriented masks may be spaced apart from the <11-20> oriented masks by a length of at least 5 μm.

According to another aspect of the present invention, there is provided a method of manufacturing a nitride-based semiconductor laser diode including the steps of: forming a GaN (gallium nitride) layer on a (0001) sapphire substrate; forming on the GaN layer at least two stripe-patterned grooves spaced apart by a distance equal to a laser cavity length along the <11-20> direction and exposing the surface of the sapphire substrate; growing an n-GaN layer on the GaN layer between the grooves so that two (1-100) edges of the n-GaN layer are thicker than the remaining regions thereof; sequentially stacking an n-clad layer, an active layer, and a p-clad layer on the n-GaN layer to form an edge-emitting laser cavity structure in which laser light generated in the active layer passes through a region of the n-clad layer aligned laterally with the active layer and is output; and etching a (1-100) plane of the laser cavity structure to form a cavity mirror plane.

Alternatively, the n-GaN layer may be formed by pendeo-epitaxial growth. The (1-100) plane of the laser cavity structure is etched by wet etching.

The pendeo-epitaxial growth includes: patterning the GaN layer between the grooves in stripes aligned along <1-100> direction to form a plurality of GaN seeds; and epitaxially growing the n-GaN layer on the GaN seeds. The GaN layer may be patterned such that ends of adjacent GaN seeds connect with each other.

In the above-mentioned embodiments, the n-clad layer may be formed of a material with a larger band gap width than the material of the active layer. For example, the n-clad layer may be made of $Al_xGa_{(1-x)}N(0 \leq x<1)$. The method may further include: forming an n-waveguide layer of $In_yGa_{(1-y)}N$ ($0 \leq y<1$) between the n-clad layer and the active layer and forming g a p-waveguide layer of $In_yGa_{(1-y)}N(0 \leq y<1)$ between the active layer and the p-clad layer.

The present invention can offer a nitride-based semiconductor laser diode designed to reduce optical damage on a cavity mirror plane and have improved characteristics by minimizing optical absorption of lasing light on the cavity mirror plane.

BRIEF DESCRIPTION OF THE DRAWINGS

The above and other features and advantages of the present invention will be described in detailed exemplary embodiments thereof with reference to the attached drawings in which.

DETAILED DESCRIPTION OF THE EXEMPLARY EMBODIMENTS

Figure 1:
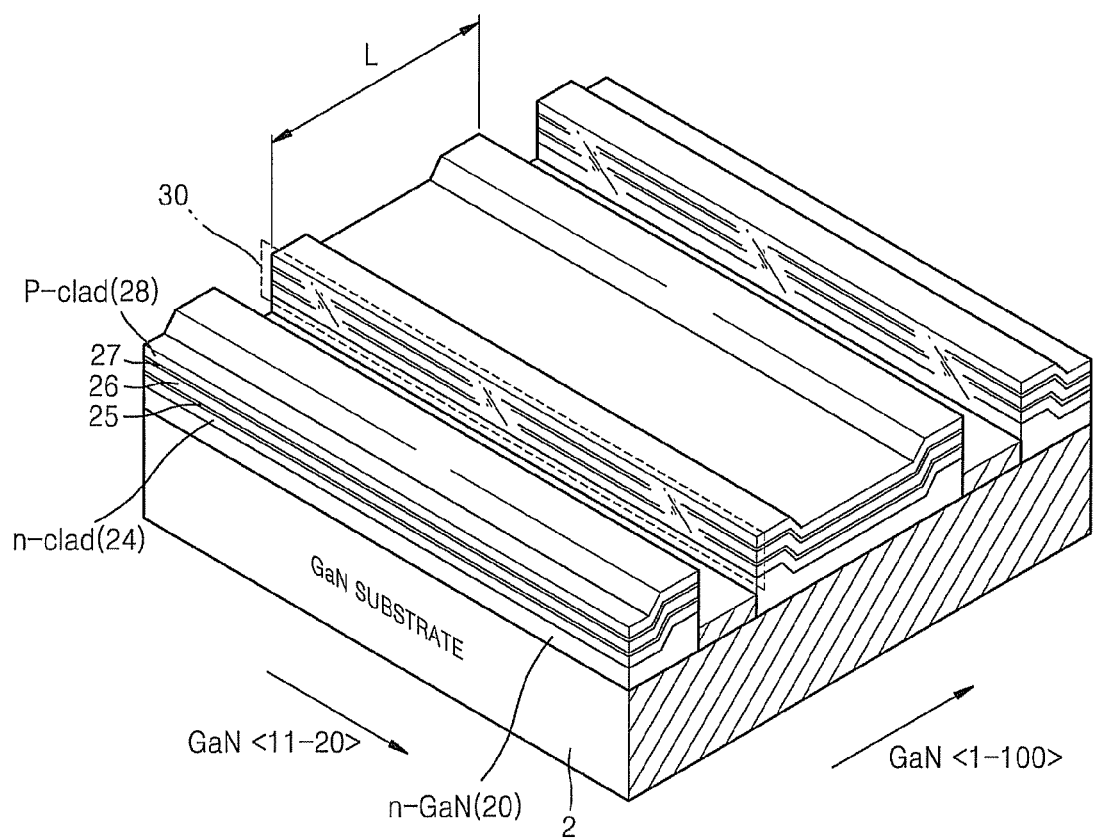
FIG. 1 is a schematic perspective view of a nitride-based semiconductor laser diode according to an embodiment of the present invention.

Hereinafter, methods of manufacturing a nitride-based semiconductor laser diode according to preferred exemplary embodiments of the present invention will be described in detail with reference to the accompanying drawings. In the drawings, the thicknesses of layers and regions are exaggerated for clarity.

Referring to FIG. 1, a nitride-based semiconductor laser diode according to an embodiment of the present invention includes a gallium nitride (GaN) substrate 2, and an n-GaN layer 20, an n-clad layer 24, an n-waveguide layer 25, an active layer 26, a p-waveguide layer 27, and a p-clad layer 28 sequentially formed on the GaN substrate 2.

The semiconductor laser diode has a laser cavity length L in the GaN <1-100> direction. Because two (1-100) edges of the n-GaN layer 20 are thicker than other regions thereof, the n-GaN layer 20 has two stepped top edges.

The n-clad layer 24, the n-waveguide layer 25, the active layer 26, the p-waveguide layer 27, and the p-clad layer 28 are sequentially stacked on the n-GaN layer 20 to a uniform thickness to form an edge-emitting laser cavity structure in which a region of the n-clad layer 24 is aligned laterally with the active layer 26. Thus, laser light generated in the active layer 26 passes through the region of n-clad layer 24 aligned laterally with the active layer 26 and is output.

A (1-100) plane of the laser cavity structure is etched to form a cavity mirror plane 30 with excellent surface roughness.

The active layer 26 may be formed of any material that can induce lasing, preferably, a material that can cause light of laser with low threshold current and stable transverse mode characteristics to oscillate. The active layer 26 may be formed of GaN-based III-V compound semiconductor, such as $In_xAl_yGa_{1-x-y}N$ ($0 \leq x<1$, $0 \leq y<1$, and $x+y<1$) containing a predetermined percentage of Al. The active layer 26 may a single quantum well (SQW) or multiquantum well (MQW) structure or various other structures. The n- and p-waveguide layers 25 and 27 may be formed of $In_yGa_{(1-y)}N$ ($0 \leq y<1$) and the n- and p-clad layers 24 and 28 may be formed of $Al_xGa_{(1-x)}N$ ($0 \leq x<1$).

The nitride-based semiconductor laser diode according to the present embodiment has a structure in which laser light generated in the active layer 26 emerges from the region of the n-clad layer 24 aligned laterally with respect to the active layer. Because the n-clad layer 24 is formed of a material such as $Al_xGa_{(1-x)}N$ ($0 \leq x<1$) with a larger band gap width than the material of the active layer 26 such as $In_xAl_yGa_{1-x-y}N$ ($0 \leq x<1$, $0 \leq y<1$, and $x+y<1$), light absorption on the cavity mirror plane 30 can be minimized. More specifically, when a band gap width of a window from which laser light emerges is larger than that of the active layer 26, absorption of laser light on the cavity mirror plane 30 is minimized, thereby increasing the threshold output power at which catastrophic optical damage (COD) occurs. This also achieves stability in the laser diode operating at an output power below the COD level. That is, by minimizing optical absorption of lasing light on the cavity mirror plane 30, optical damage on the cavity mirror plane 30 can be reduced and characteristics of the nitride-based semiconductor laser device can be improved.

Figure 2:
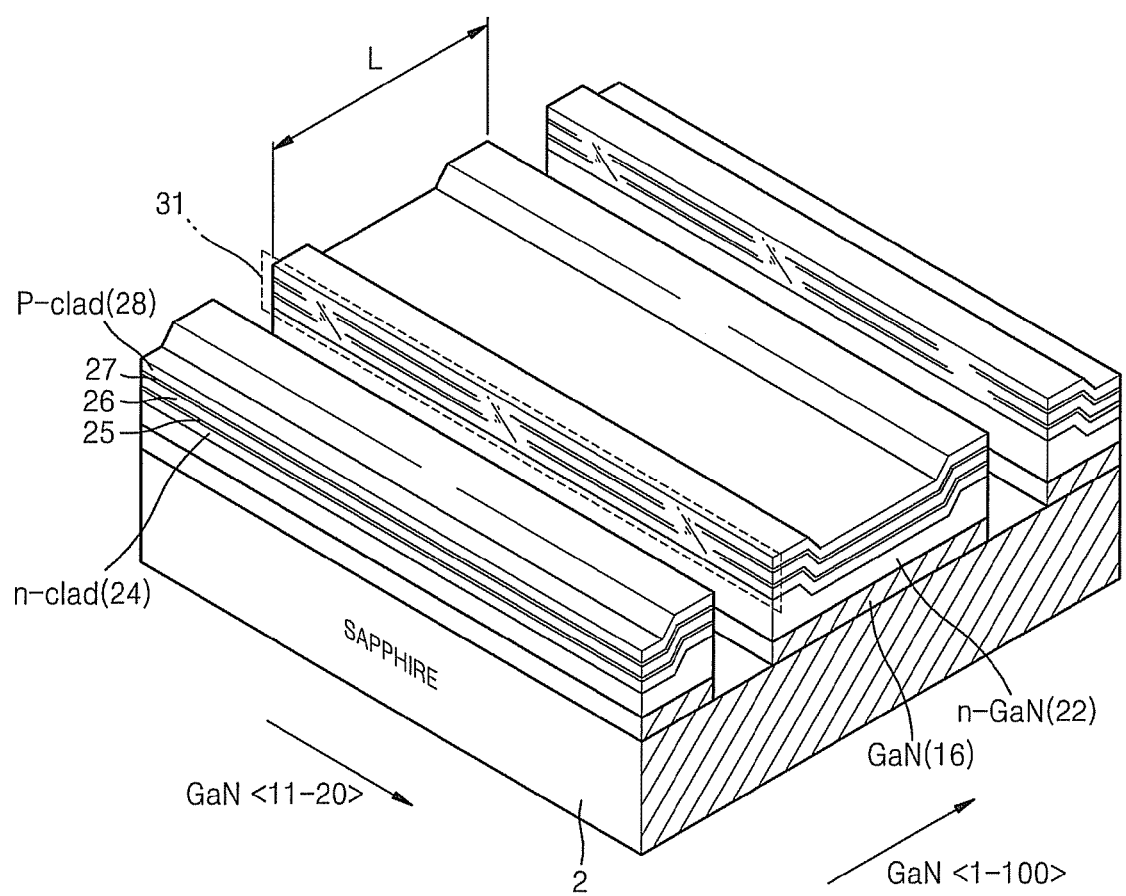
FIG. 2 is a schematic perspective view of a nitride-based semiconductor laser diode according to another embodiment of the present invention.

FIG. 2 is a schematic perspective view of a nitride-based semiconductor laser diode according to another embodiment of the present invention. Like reference numerals in FIGS. 1 and 2 denote like elements, and thus their description is omitted. Referring to FIG. 2, the nitride-based semiconductor laser diode according to the present embodiment has the same structure as that shown in FIG. 1 except that a GaN substrate stacked on a sapphire substrate is used instead of a freestanding GaN substrate. As will be described later, due to this difference, the nitride-based semiconductor laser diode of FIG. 2 is manufactured using a different process than the semiconductor laser diode of FIG. 1.

FIGS. 3A-3F are flow charts illustrating a method of manufacturing a nitride-based semiconductor laser diode according to an embodiment of the present invention. Because the technique for forming each material layer during manufacturing of the nitride-based semiconductor laser diode is widely known in the art, a detailed description thereof is not provided. For example, each material layer may be formed using a thin film deposition technique such as chemical vapor deposition (CVD), metal-organic CVD (MOCVD), plasma enhanced CVD (PECVD), or physical vapor deposition (PVD).

Figure 3A:
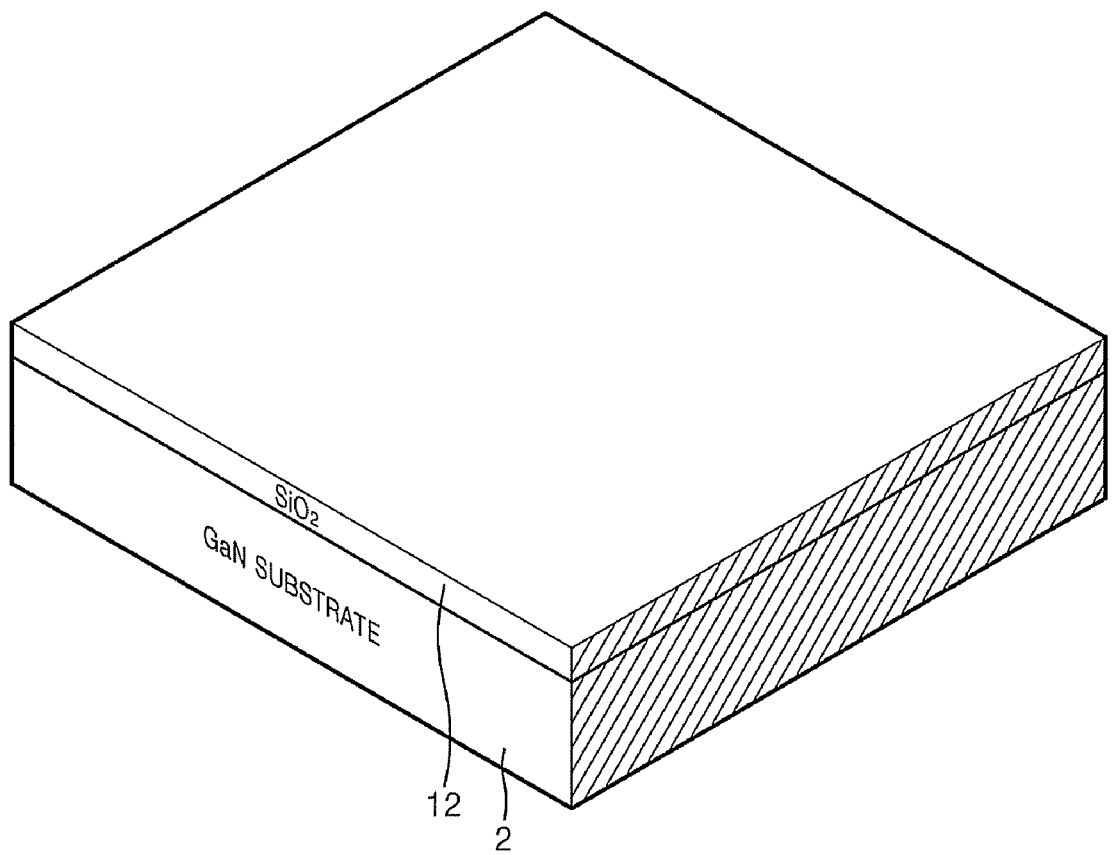
FIGS. 3A-3F are flow charts illustrating a method of manufacturing a nitride-based semiconductor laser diode according to an embodiment of the present invention.
Figure 3B:
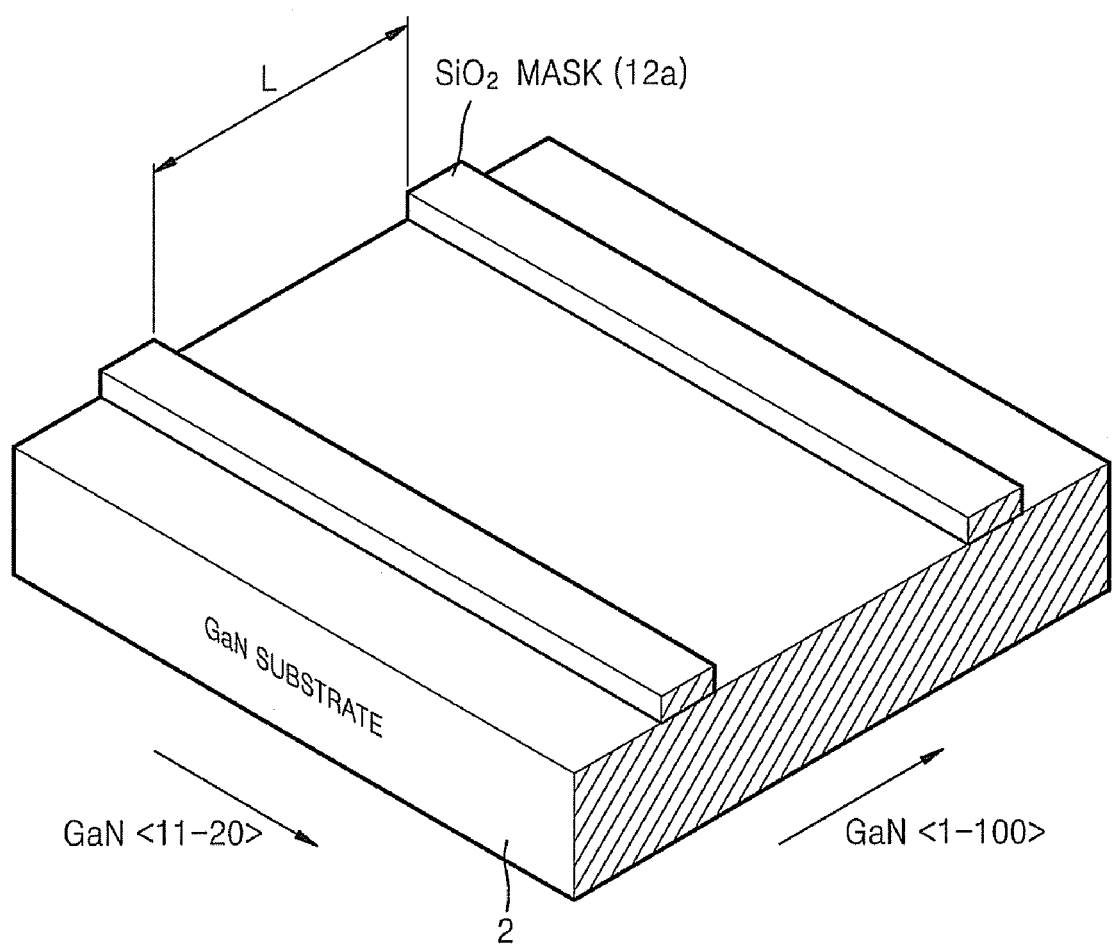

Referring to FIGS. 3A and 3B, a (0001) GaN substrate 2 is prepared and a $SiO_2$ layer 12 is formed on the GaN substrate 2. Then, the $SiO_2$ layer 12 is patterned to form at least two $SiO_2$ masks 12a spaced apart by a distance equal to the laser cavity length L. The $SiO_2$ masks 12a are stripes that extend along the <11-20> direction of the underlying GaN substrate. The laser cavity length L may be in the range of approximately 100 to 2,000 μm and the mask 12a may have a width of approximately 5 to 100 μm. The mask 12a may be formed of $SiO_2$, SiN, W, or various other materials.

Figure 3C:
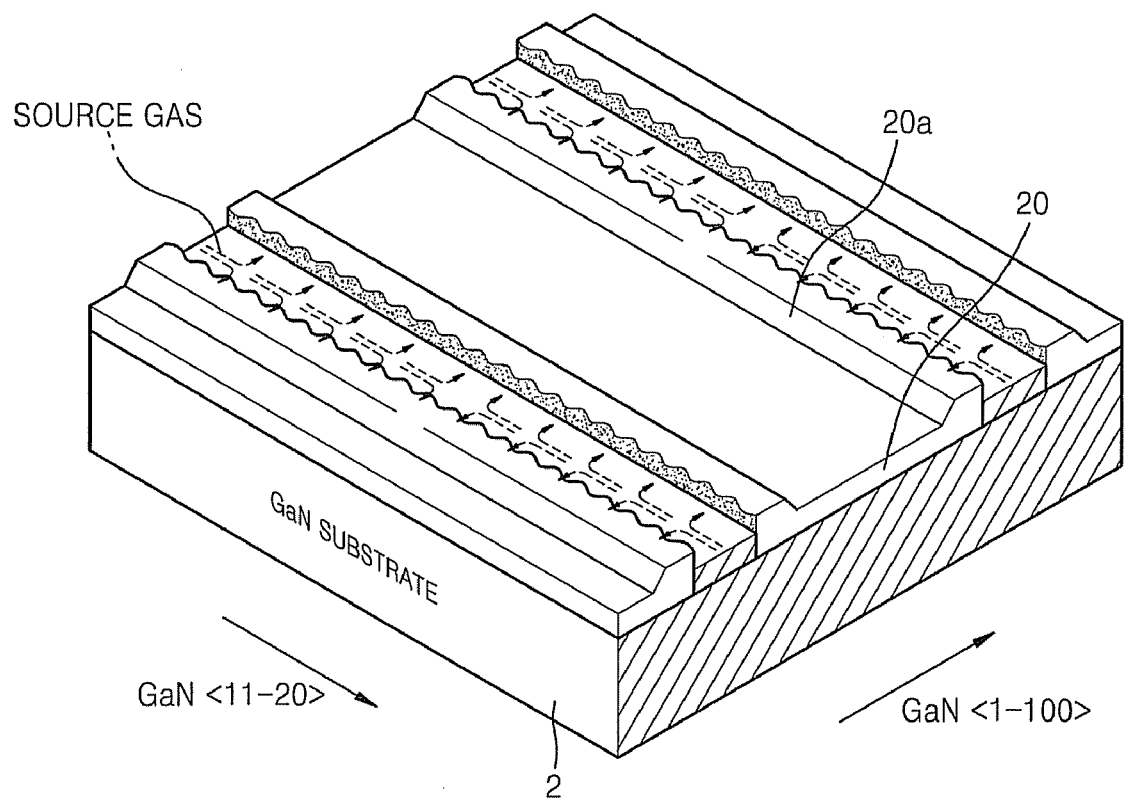

Referring to FIG. 3C, an n-GaN layer 20 is epitaxially grown on the GaN substrate 2 between the masks 12a. Due to the presence of the masks 12a, two (1-100) edges of the n-GaN layer 20 are grown thicker than other regions thereof. More specifically, the mask 12a provides a path for diffusing residual source gas that is not used for the growth of the n-GaN layer 20. That is, as indicated by an arrow, the residual source gas is preferentially supplied to the two (1-100) edges of the n-GaN layer 20 along the top surface of the mask 12a. Thus, the two (1-100) edges of the n-GaN layer 20 are grown thicker than the remaining regions thereof so that top edges have stepped portions 20a. The stepped surface of the n-GaN layer 20 affects the geometries of layers that will subsequently be stacked thereon, i.e., the construction of the laser cavity structure, which will be described in more detail hereafter.

Figure 5:
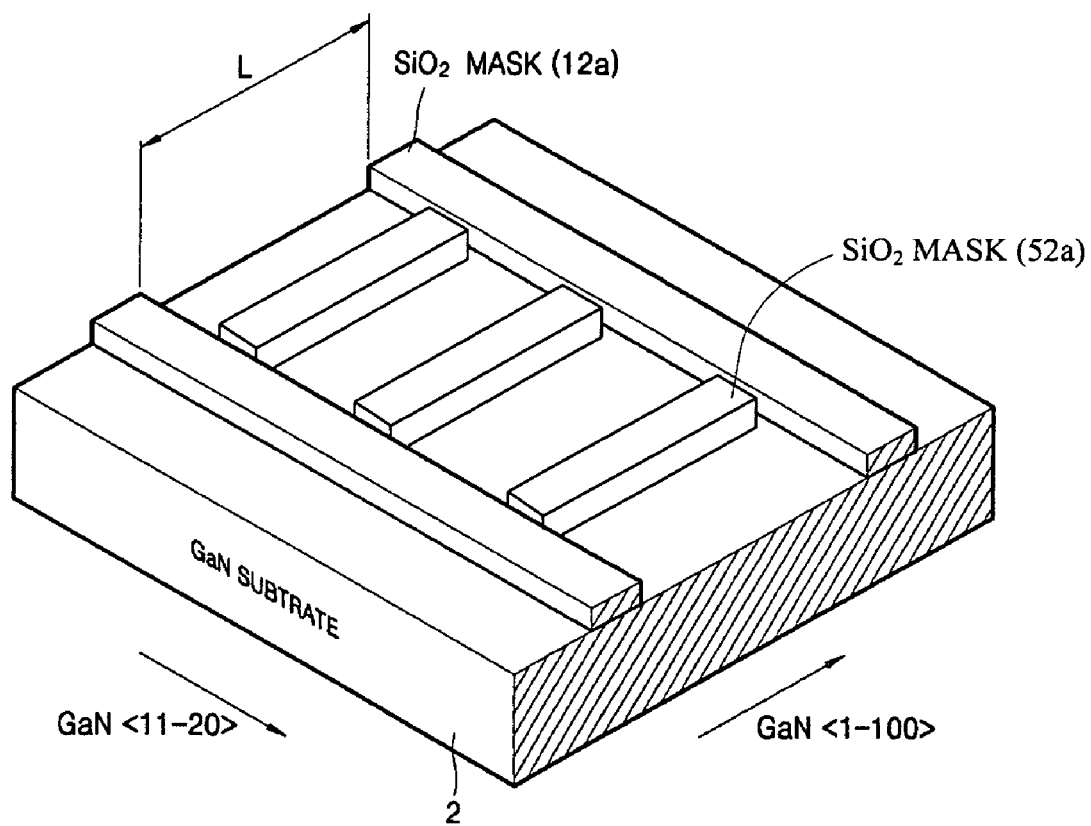
FIG. 5 is a schematic perspective view illustrating a method of forming additional stripe-patterned masks in the <1-100> direction between stripe-patterned masks formed in the <11-20> direction on a GaN substrate, according to another embodiment of the present invention.

Although not shown in FIGS. 3A-3C, the n-GaN layer 20 may be formed by epitaxial lateral overgrowth (ELO). Because U.S. Pat. No. 6,051,849, which is incorporated herein by reference, discusses in detail the structure and effect obtained by the ELO technique, a detailed explanation is not included. The ELO technique can apply to the manufacturing process shown in FIGS. 3A-3C. More specifically, as shown in FIG. 5, additional stripe-patterned $SiO_2$ masks 52a are formed in <1-100> direction between the <11-20> oriented $SiO_2$ masks 12a. The <1-100> oriented masks 52a may be spaced apart from the <11-20> oriented $SiO_2$ masks 12a by a length of at least 5 μm. Then, the n-GaN layer 20 may be epitaxially grown on the GaN substrate 2 not covered with the <11-20> oriented masks 12a and <1-100> oriented masks. This ELO technique can minimize the formation of defects such as a dislocation within the n-GaN layer 20.

Figure 3D:
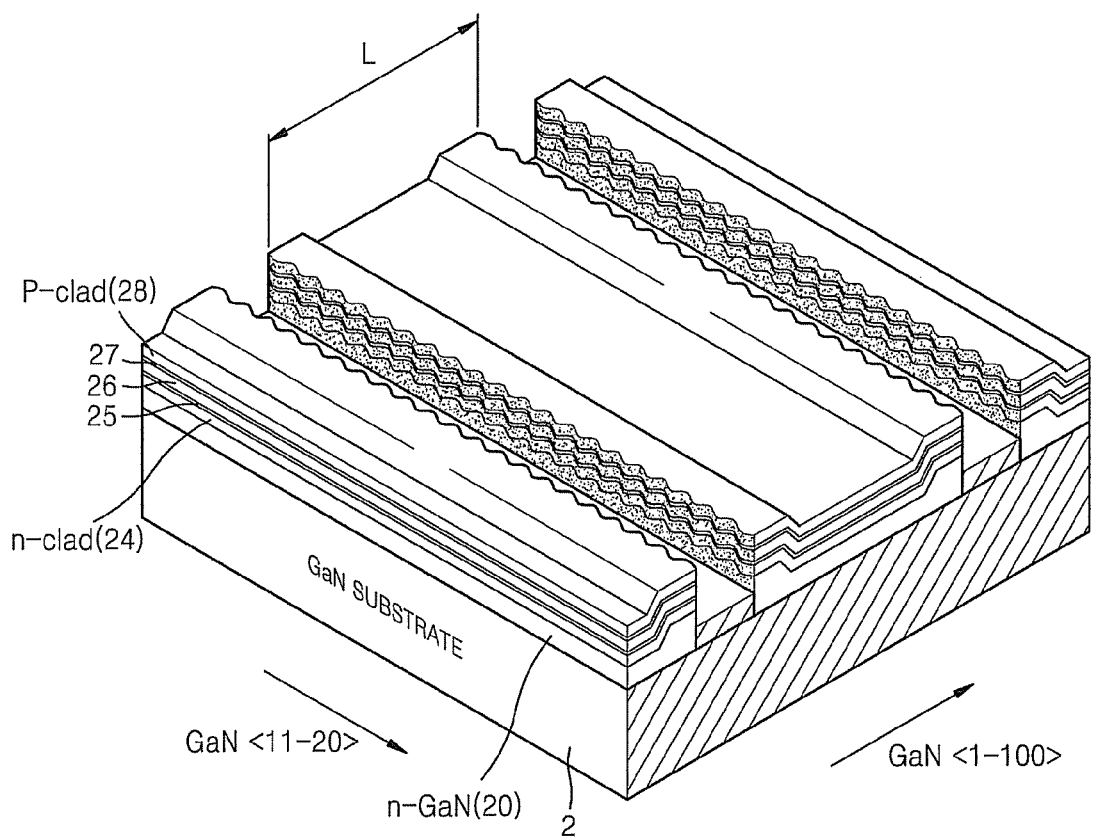

Referring to FIG. 3D, an n-clad layer 24, an n-waveguide layer 25, an active layer 26, a p-waveguide layer 27, and a p-clad layer 28 are sequentially stacked on the n-GaN layer 20 to form an edge-emitting laser cavity structure in which a region of the n-clad layer 24 is aligned laterally with the active layer 26. In the laser cavity structure, laser light generated in the active layer 26 can pass through the region of n-clad layer 24 aligned laterally with the active layer 26 and is output.

The active layer 26 may be formed of any material that can induce lasing, preferably, a material that can cause light of a laser with a low threshold current and stable transverse mode characteristics to oscillate. The active layer 26 may be formed of GaN-based III-V compound semiconductor such as $In_xAl_yGa_{1-x-y}N$ (0≦x<1, 0≦y<1, and x+y<1) containing a predetermined percentage of Al. The active layer 26 may be a single quantum well (SQW) or multiquantum well (MQW) structure or various other structures. The n- and p-waveguide layers 25 and 27 may be formed of $In_yGa_{(1-y)}N$ (0≦y<1) and be omitted because they are not essential elements.

The n-clad layer 24 should be formed of a material with a larger band gap width than the material of the active layer 26. For example, the n- and p-clad layers 24 and 28 may be formed of $Al_xGa_{(1-x)}N$ (0≦x<1).

Because the n-clad layer 24 is formed of a material such as $Al_xGa_{(1-x)}N$ (0≦x<1) with a larger band gap width than the material of the active layer 26 such as $In_xAl_yGa_{1-x-y}N$ (0≦x<1, 0≦y<1, and x+y<1), light absorption on a cavity mirror plane 30 can be minimized. More specifically, when a band gap width of a window from which laser light emerges is larger than that of the active layer 26, absorption of laser light on the cavity mirror plane 30 is minimized, thereby increasing threshold output power at which COD occurs. This also achieves stability of laser diode operating at an output power below the COD level. That is, by minimizing optical absorption of lasing light on the cavity mirror plane 30, optical damage on the cavity mirror plane 30 can be reduced and the characteristics of the nitride-based semiconductor laser device can be improved.

Figure 3E:
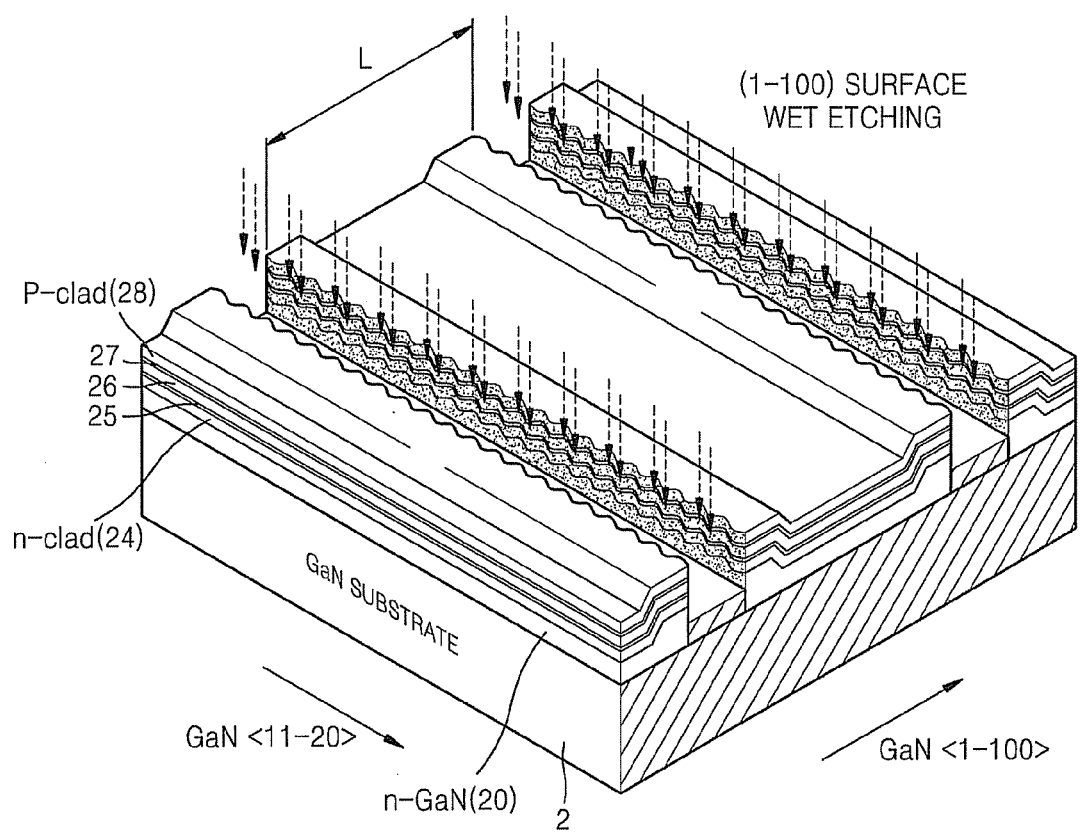
Figure 3F:
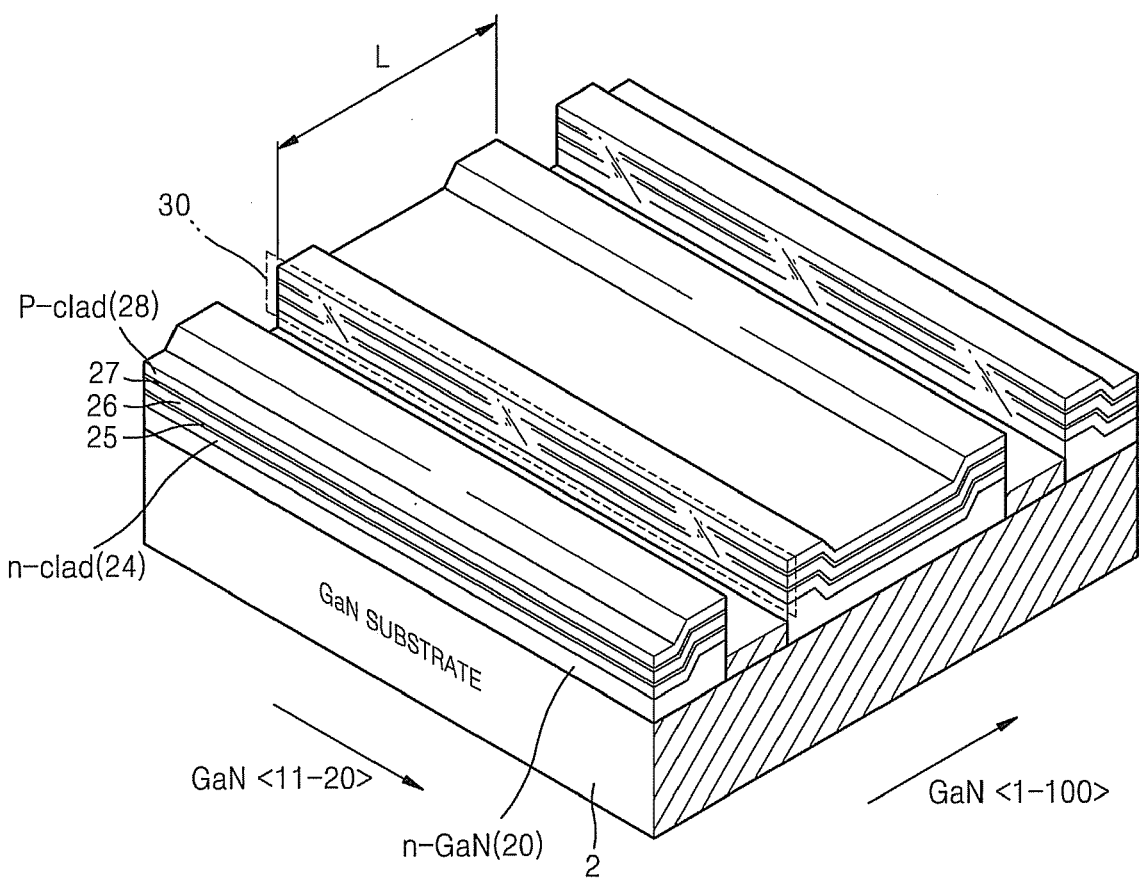

Referring to FIGS. 3E and 3F, a (1-100) plane of the laser cavity structure is etched by wet etching to form a cavity mirror plane 30 with minimized roughness close to that of an atomically single plane. For the wet etching, an etchant is selected from the group consisting of KOH dissolved in ethylene glycol, molten KOH, NaOH dissolved in ethylene glycol, molten NaOH, and phosphoric acid. Optical absorption on the cavity mirror plane 30 having excellent surface roughness can be reduced compared to a conventional nitride-based semiconductor laser diode, thereby improving the characteristics of the semiconductor laser diode.

FIGS. 4A-4F are flow charts illustrating a method of manufacturing a nitride-based semiconductor laser diode according to another embodiment of the present invention. Like reference numerals in FIGS. 3A-3F denote like elements, and thus their description is not provided.

Figure 4A:
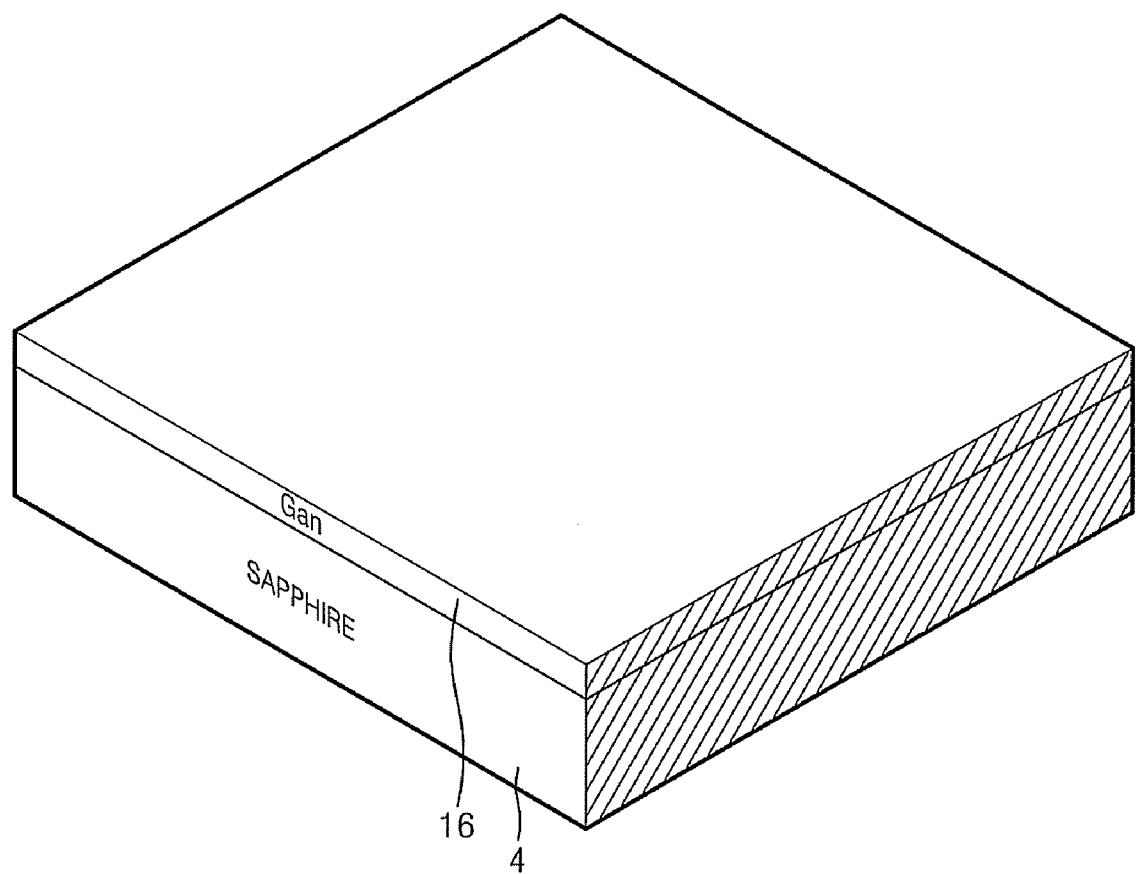
FIGS. 4A-4F are flow charts illustrating a method of manufacturing a nitride-based semiconductor laser diode according to another embodiment of the present invention.
Figure 4B:
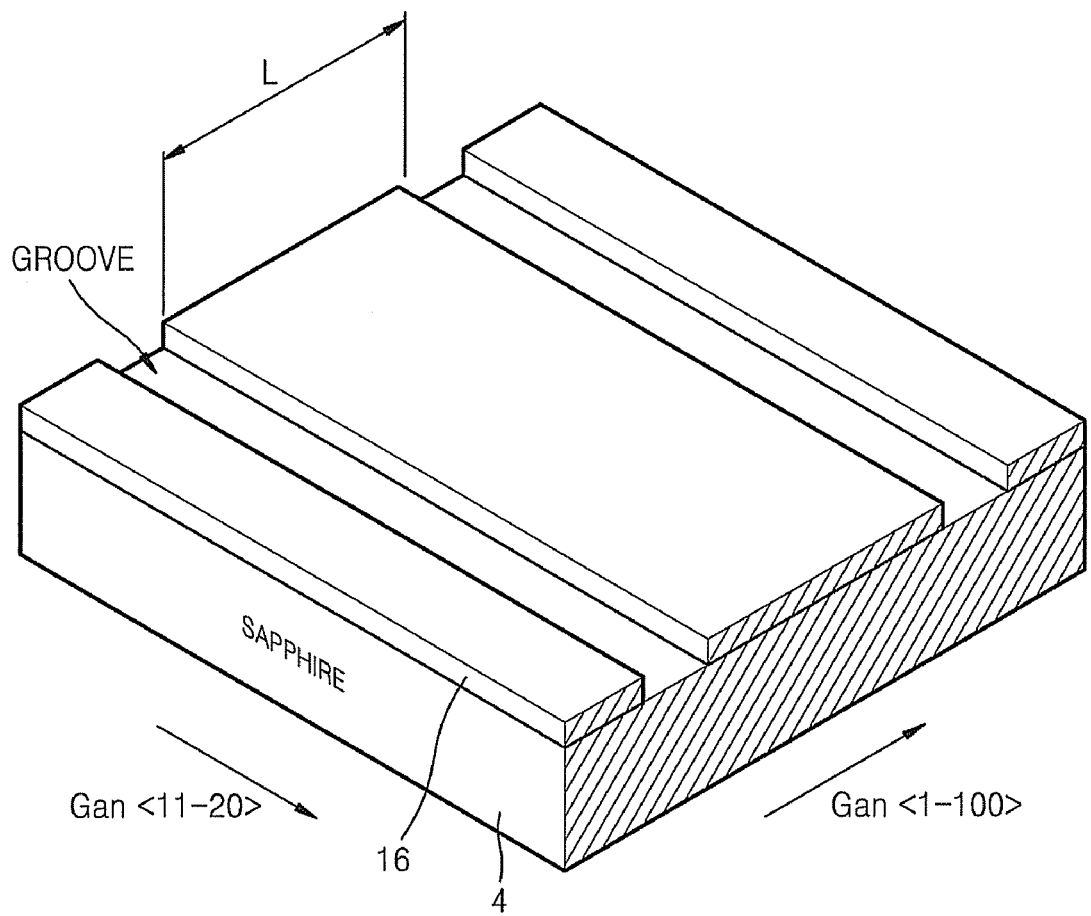

Referring to FIGS. 4A and 4B, a (0001) sapphire substrate 4 is prepared and a GaN layer 16 is formed on the sapphire substrate 4. Then, at least two grooves spaced apart by a distance equal to the laser cavity length L are formed in the GaN layer 16 to expose the surface of the sapphire substrate 4. The grooves are stripes that extend along the <11-20> direction of the GaN layer 16. The laser cavity length L may be in the range of approximately 100 to 2,000 μm and the groove may have a width of approximately 5 to 100 μm.

Figure 4C:
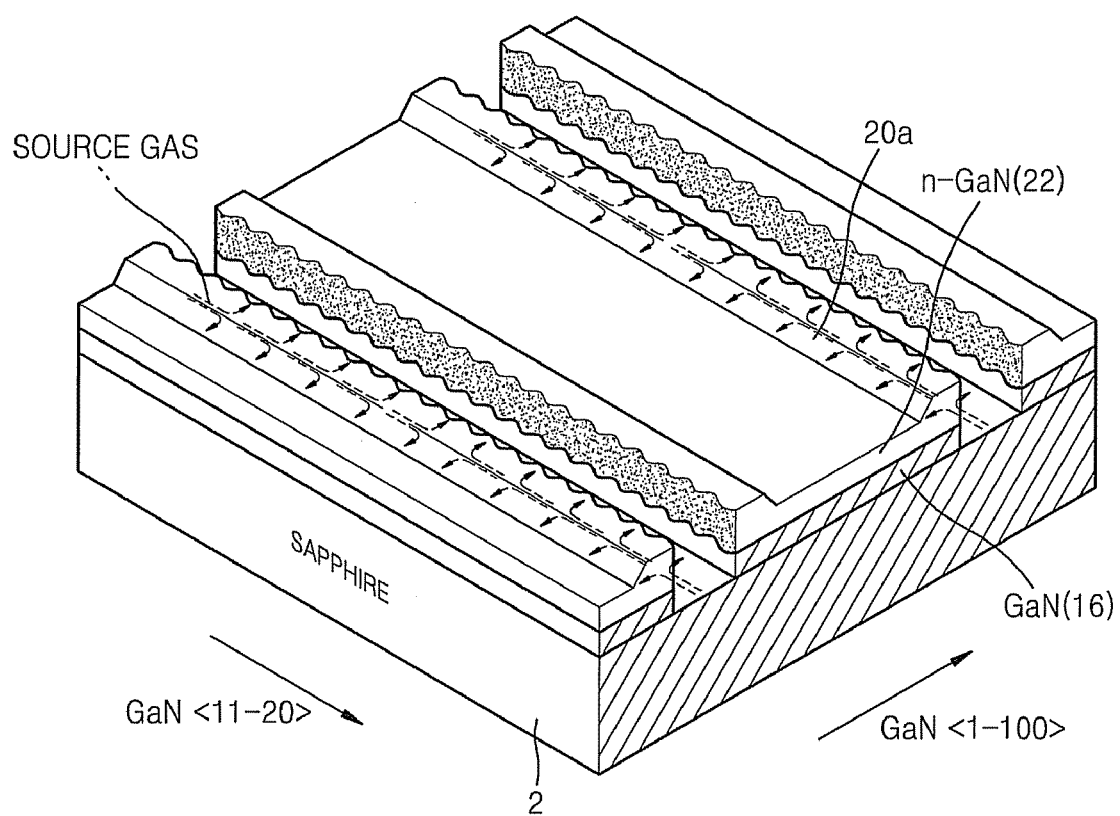

Referring to FIG. 4C, an n-GaN layer 22 is epitaxially grown on the GaN layer 16 between the grooves. Due to the formation of the grooves, two (1-100) edges of the n-GaN layer 22 are grown thicker than other regions thereof. More specifically, the groove provides a path for diffusing residual source gas that is not used for the growth of the n-GaN layer 22. That is, as indicated by an arrow, the residual source gas is preferentially supplied to the two (1-100) edges of the n-GaN layer 22 along the grooves. Thus, the two (1-100) edges of the n-GaN layer 22 are grown thicker than the remaining regions thereof so that top edges have stepped portions 20a. As described above with reference to FIGS. 3A-3F, the stepped surface of the n-GaN layer 22 affects the geometries of layers that will subsequently be stacked thereon, i.e., the construction of the laser cavity structure.

Although not shown in FIGS. 4A-4C, the n-GaN layer 22 may be formed by pendeo-epitaxial growth. Since U.S. Pat. No. 6,265,289 which is incorporated herein by reference discusses in detail the structure and effect obtained by the pendeo-epitaxial growth technique, a detailed explanation thereof is not included. The pendeo-epitaxial growth technique can be applied in the manufacturing process shown in FIGS. 4A-4C. More specifically, the GaN layer 16 between the grooves are patterned in stripes aligned along the <1-100> direction to form a plurality of GaN seeds (not shown). In this case, the GaN layer 16 may be patterned such that ends of adjacent GaN seeds connect with each other. Then, the n-GaN layer 22 may be epitaxially grown on the GaN seeds. The pendeo-epitaxial growth technique can minimize the formation of a defect such as a dislocation within the n-GaN layer 22.

Figure 4D:
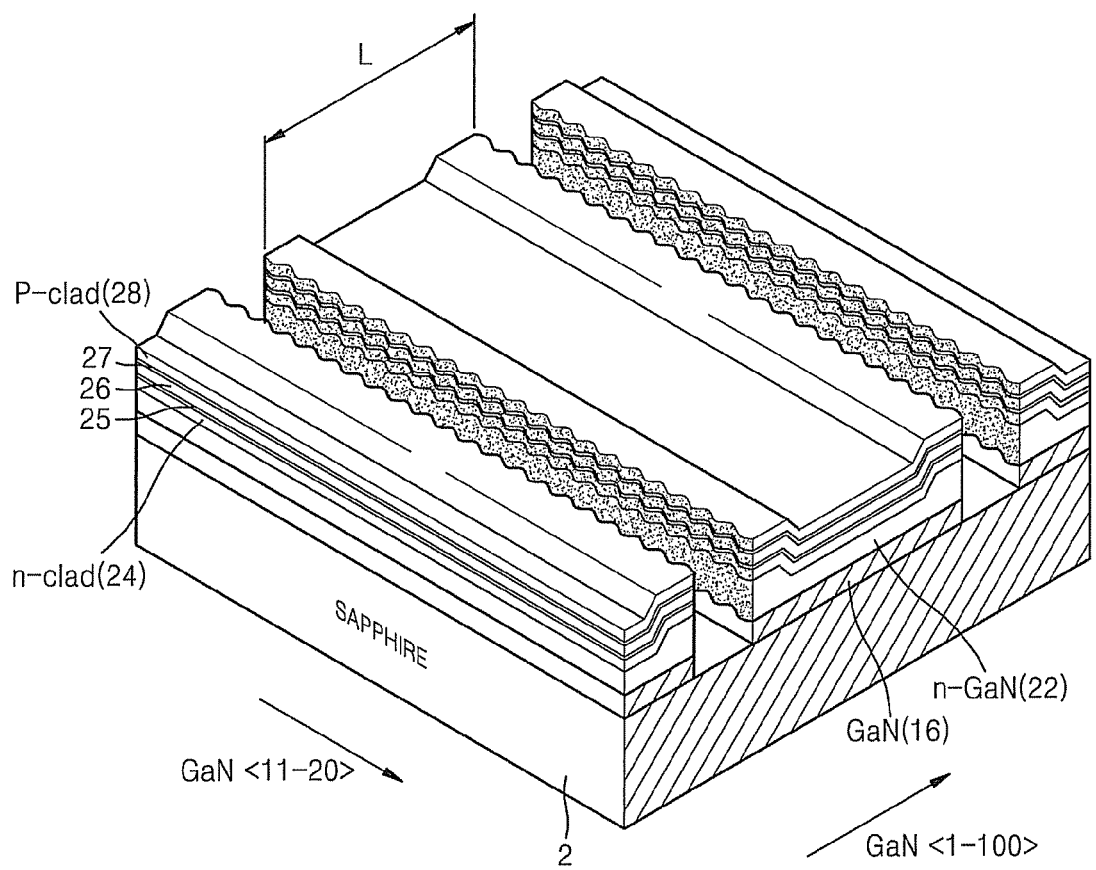
Figure 4E:
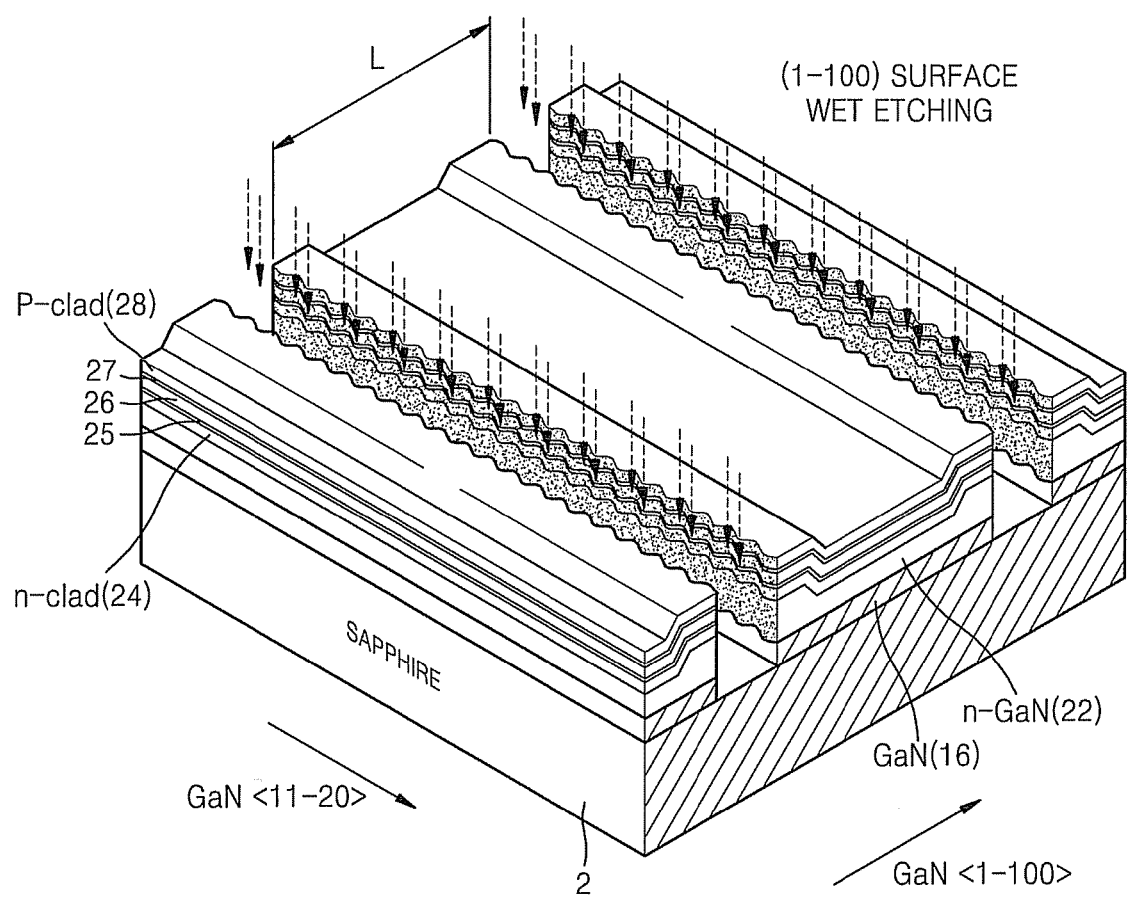
Figure 4F:
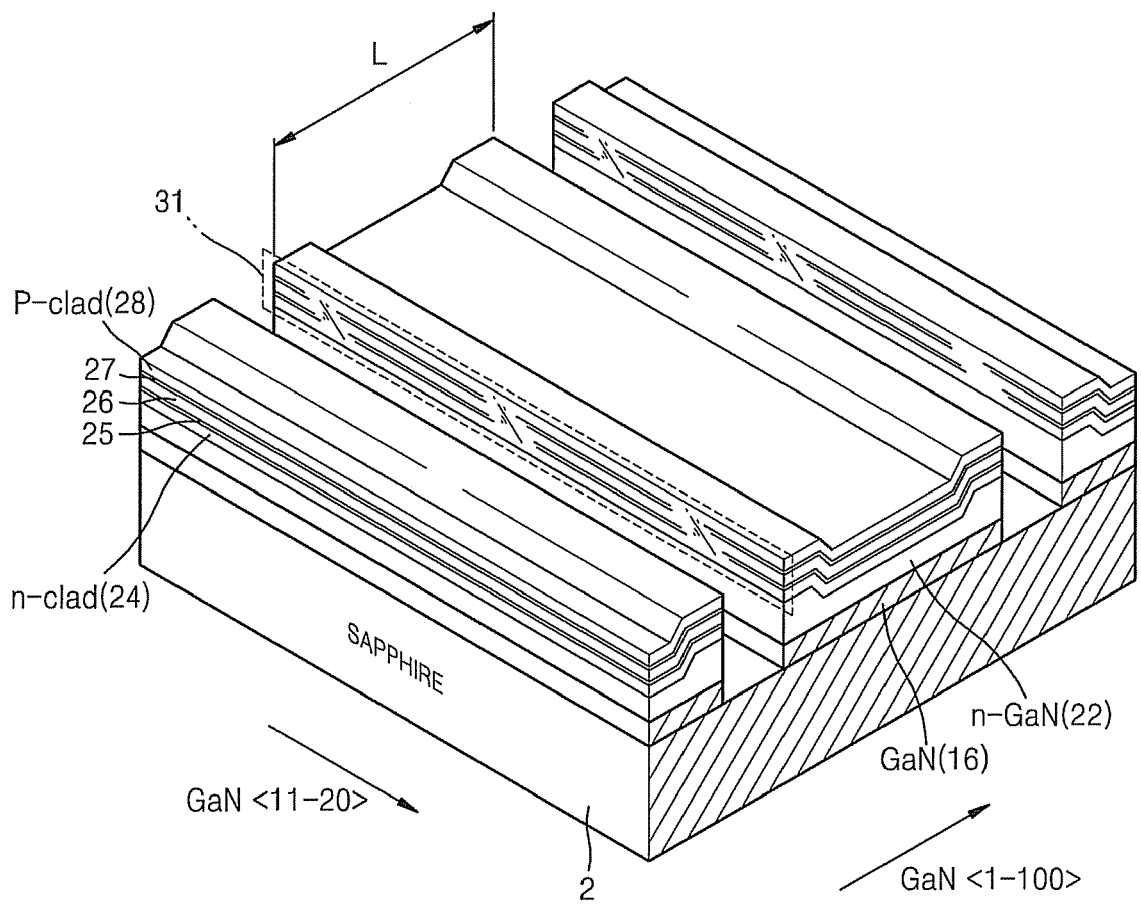

Referring to FIGS. 4D-4F, an n-clad layer 24, an n-waveguide layer 25, an active layer 26, a p-waveguide layer 27, and a p-clad layer 28 are sequentially stacked on the n-GaN layer 22 to form an edge-emitting laser cavity structure in which a region of the n-clad layer 24 is aligned laterally with the active layer 26. Then, a (1-100) plane of the laser cavity structure is etched to form a cavity mirror plane 30. Because the process steps illustrated in FIGS. 4D-4F are the same as the steps of FIGS. 3D-3F, a detailed explanation thereof is not included.

The present invention provides a nitride-based semiconductor laser diode having a cavity mirror plane with a minimized surface roughness close to that of an atomically single plane. In particular, the nitride-based semiconductor laser diode of the present invention allows lasing light generated in an active layer to emerge laterally from an n-clad layer formed of a material with a larger band gap width than the material of the active layer, thereby minimizing absorption of light on the cavity mirror plane. This reduces optical damage on the cavity mirror plane and improves the characteristics of the nitride-based semiconductor laser diode.

While the present invention has been particularly shown and described with reference to exemplary embodiments thereof, it will be understood by those of ordinary skill in the art that various changes in form and details may be made therein without departing from the spirit and scope of the present invention as defined by the following claims. That is, the present invention is not restricted to the structure and arrangement described above.

What is claimed is:

1. A method of manufacturing a nitride-based semiconductor laser diode, the method comprising:

forming on a (0001) GaN (gallium nitride) substrate at least two <11-20> oriented masks spaced apart by a distance equal to a laser cavity length in stripes that extend along the <11-20> direction of the GaN substrate;

growing an n-GaN layer on the GaN substrate so that two regions of the n-GaN are disposed such that each region is disposed corresponding to an individual <11-20> mask of the at least two <11-20> oriented masks, and each region includes two <11-20> oriented n-GaN portions which oppose each other with respect to the individual <11-20> mask, wherein the two <11-20> oriented n-GaN portions of each region have a greater thickness than a remaining portion of the n-GaN layer, and wherein n-GaN is not disposed between the two <11-20> oriented n-GaN portions in each region;

sequentially stacking an n-clad layer, an active layer, and a p-clad layer on the n-GaN layer to form an edge-emitting laser cavity structure in which laser light generated in the active layer passes through a region of the n-clad layer aligned laterally with the active layer and is output; and etching a (1-100) plane of the laser cavity structure to form a cavity mirror plane, wherein the at least two <11-20> oriented masks provide a path for diffusing residual source gas when the n-GaN layer is being grown.

2. The method of claim 1, wherein the at least two <11-20> oriented masks are formed of a material selected from the group consisting of $SiO_2$, SiN, and W.

3. The method of claim 1, wherein the n-clad layer is formed of a material with a larger band gap width than the material of the active layer.

4. The method of claim 3, wherein the n-clad layer having the larger band gap width than the material of the active layer reduces absorption of light emerging from the n-clad layer on the cavity mirror plane.

5. The method of claim 1, wherein the n-clad layer is made of $Al_xGa_{(1-x)}N (0 \leq x<1)$.

6. The method of claim 1, further comprising forming an n-waveguide layer of $In_yGa_{(1-y)}N$ ($0 \leq y<1$) between the n-clad layer and the active layer.

7. The method of claim 6, further comprising a p-waveguide layer of $In_yGa_{(1-y)}N$ ($0 \leq y<1$) between the active layer and the p-clad layer.

8. The method of claim 1, wherein the (1-100) plane of the laser cavity structure is etched by wet etching.

9. The method of claim 8, wherein an etchant used in the wet etching is a material selected from the group consisting of KOH dissolved in ethylene glycol, molten KOH, NaOH dissolved in ethylene glycol, molten NaOH, and phosphoric acid.

10. The method of claim 1, wherein the n-GaN layer is formed by ELO (Epitaxial Lateral Overgrowth).

11. The method of claim 10, wherein the ELO comprises:

forming additional stripe-patterned <1-100> oriented masks in the <1-100> direction between the at least two <11-20> oriented masks; and epitaxially growing the n-GaN layer on the GaN substrate not covered with the <1-100> oriented masks and the at least two <11-20> oriented masks.

12. The method of claim 11, wherein the <1-100> oriented masks are spaced apart from the at least two <11-20> oriented masks by a length of at least 5 μm.

13. The method of claim 1, wherein the laser cavity length ranges from approximately 100 to 2,000 μm.

14. The method of claim 1, wherein the at least two <11-20> oriented masks each have a width of approximately 5 to 100 μm.

15. The method of claim 1, wherein the cavity mirror plane has a surface roughness approximate to a surface roughness of an atomically single plane.

16. The method of claim 1, wherein the laser light generated in the active layer emerges laterally from the region of the n-clad layer aligned laterally with the active layer.

17. The method of claim 1, wherein the n-clad layer, the active layer and the p-clad layer are sequentially stacked on the n-GaN layer to a uniform thickness.

18. The method of claim 17, wherein regions of the n-clad layer, the active layer and the p-clad layer stacked on the two <11-20> oriented n-GaN portions of the two regions of the n-GaN layer are disposed a greater distance away from the GaN substrate than regions of the n-clad layer, the active layer and the p-clad layer stacked on the remaining regions of the n-GaN layer.

* * * * *